United States Patent
Manipatruni et al.

(10) Patent No.: US 10,622,132 B2
(45) Date of Patent: Apr. 14, 2020

(54) SPIN LOGIC DEVICE WITH HIGH SPIN INJECTION EFFICIENCY FROM A MATCHED SPIN TRANSFER LAYER

(71) Applicant: Intel Corporation, Santa Clara, CA (US)

(72) Inventors: Sasikanth Manipatruni, Hillsboro, OR (US); Anurag Chaudhry, Portland, OR (US); Dmitri E. Nikonov, Beaverton, OR (US); David J. Michalak, Portland, OR (US); Ian A. Young, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 324 days.

(21) Appl. No.: 15/569,975

(22) PCT Filed: Jun. 24, 2015

(86) PCT No.: PCT/US2015/037447
§ 371 (c)(1),
(2) Date: Oct. 27, 2017

(87) PCT Pub. No.: WO2016/209227
PCT Pub. Date: Dec. 29, 2016

(65) Prior Publication Data
US 2018/0158587 A1    Jun. 7, 2018

(51) Int. Cl.
*H01F 10/32* (2006.01)
*H01F 41/30* (2006.01)
(Continued)

(52) U.S. Cl.
CPC ..... *H01F 10/3254* (2013.01); *H01F 10/1936* (2013.01); *H01F 10/30* (2013.01);
(Continued)

(58) Field of Classification Search
CPC ......... H01L 43/02; H01L 43/08; H01L 43/10; H01L 43/12; G11C 11/14–16; G11C 11/161
See application file for complete search history.

(56) References Cited

U.S. PATENT DOCUMENTS 7,313,013 B2 * 12/2007 Sun ................. G11C 11/161
257/427
7,663,197 B2 *  2/2010 Nagase ................. B82Y 25/00
257/421

(Continued)

FOREIGN PATENT DOCUMENTS

CN      104425002      3/2015
KR    1020080070812    7/2008
(Continued)

OTHER PUBLICATIONS

Extended European Search Report dated Feb. 4, 2019 for EP Patent Application No. 15896518.6
(Continued)

*Primary Examiner* — Allison Bernstein
(74) *Attorney, Agent, or Firm* — Green, Howard & Mughal LLP

(57) ABSTRACT

Described is an apparatus which comprises: an input magnet formed of one or more materials with a sufficiently high anisotropy and sufficiently low magnetic saturation to increase injection of spin currents; and a first interface layer coupled to the input magnet, wherein the first interface layer is formed of non-magnetic material such that the first interface layer and the input magnet together have sufficiently matched atomistic crystalline layers.

25 Claims, 9 Drawing Sheets

(51) Int. Cl.
| | |
|---|---|
| *H01F 10/193* | (2006.01) |
| *H03K 19/16* | (2006.01) |
| *H01L 43/12* | (2006.01) |
| *H01L 43/10* | (2006.01) |
| *H01L 43/08* | (2006.01) |
| *H01F 10/30* | (2006.01) |
| *B82Y 25/00* | (2011.01) |

(52) U.S. Cl.
CPC ......... *H01F 10/329* (2013.01); *H01F 41/308* (2013.01); *H01L 43/08* (2013.01); *H01L 43/10* (2013.01); *H01L 43/12* (2013.01); *H03K 19/16* (2013.01); *B82Y 25/00* (2013.01)

(56) References Cited

U.S. PATENT DOCUMENTS

| | | | |
|---|---|---|---|
| 7,933,145 | B2 | 4/2011 | Yamagishi et al. |
| 8,786,040 | B2 | 7/2014 | Doyle et al. |
| 9,712,171 | B2 | 7/2017 | Nikonov et al. |
| 2012/0112299 | A1 | 5/2012 | Inomata et al. |
| 2012/0176154 | A1 | 7/2012 | Behin-Aein et al. |
| 2012/0273456 | A1 | 11/2012 | Masatoshi et al. |
| 2014/0022036 | A1 | 1/2014 | Lambson et al. |
| 2014/0091411 | A1 | 4/2014 | Manipatruni et al. |
| 2014/0139265 | A1 | 5/2014 | Manipatruni et al. |
| 2018/0240583 | A1* | 8/2018 | Manipatruni ......... G11C 11/161 |

FOREIGN PATENT DOCUMENTS

| | | |
|---|---|---|
| TW | 200947777 | 11/2009 |
| TW | 201435868 | 9/2014 |
| WO | 2006023018 | 3/2006 |

OTHER PUBLICATIONS

Hase et al., "Current-Perpendicular-to-plane spin valves with a Co2Mn (Ga0.5Sn0.5) Heusler Alloy", Journal of Applied Physics, V. 108, No. 9, (Nov. 5, 2010); (5 pages) https://doi.org/10.1063/1.3503869; ISSN: 0021-8979.

Nakatani et al., "Co-Based Heusler Alloys for CPP-GMR Spin-Valves with Large Magnetoresistive oOtputs", IEEE Transactions on Magnetics Vo. 48, No. 5, May 11, 2015 (7 pages); XP011441844, ISSN: 0018-9464, DOI: 10.1109/TMAG.2011.2174436.

International Preliminary Report on Patentability for International Patent Application No. PCT/US15/37447, dated Jan. 4, 2018.

Non-Final Office Action and Search Report dated Jul. 18, 2019 for Taiwan Patent Application No. 105115184, 8 pgs.

International Search Report and Written Opinion for International Patent Application No. PCT/US15/37447, dated Mar. 22, 2016.

Office Action from Chinese Patent Application No. 201580080381.1 dated Sep. 25, 2019, 16 pgs.

* cited by examiner

SPIN LOGIC DEVICE WITH HIGH SPIN INJECTION EFFICIENCY FROM A MATCHED SPIN TRANSFER LAYER

CLAIM OF PRIORITY

This Application is a National Stage Entry of, and claims priority to, PCT Application No. PCT/US15/37447, filed on 24 Jun. 2015 and titled "A SPIN LOGIC DEVICE WITH HIGH SPIN INJECTION EFFICIENCY FROM A MATCHED SPIN TRANSFER LAYER", which is incorporated by reference in its entirety for all purposes.

BACKGROUND

FIG. 1 illustrates a typical spin logic device 100 with stacking of magnets above a spin channel. To illustrate the deficiencies of device 100, a brief overview of forming device 100 is described. Device 100 is formed by depositing a metal (e.g., Cu) for providing a ground supply and then depositing a layer of oxide over the metal. The metal for the ground supply forms the bottom of device 100. The oxide is then etched to form a via hole which is then filled with metal to form a Via. A metal layer (e.g. layer of Cu) is again deposited to form a Spin Channel. Parts of the Spin Channel are then etched to form barriers between the Spin Channel. Oxide is then deposited into these barriers. Followed by oxide deposition, a magnet layer is deposited and selectively etched to form input and output magnets (e.g., Magnet on the left and Magnet on the right, respectively). These magnets are in direct contact with the Spin Channel. Metal (e.g., Cu) is then deposited on the etched magnets to provide supply contacts followed by a layer of deposition of a metal layer (e.g., layer of Cu) for providing power supply. The metal for power supply forms the top of device 100.

While spin logic and spin memory can enable a new class of logic devices and architectures for beyond Complementary Metal Oxide Semiconductor (CMOS) computing, they suffer from certain deficiencies. For example, existing spin devices such as device 100 suffer from low speed and require high current operation due to magnetic switching speed being limited by the strength of magnetic anisotropy ($H_k$) and low polarization of spin injection from the magnets into the spin channel.

The manufacturing of spin device such as device 100 is expensive. For example, forming the oxide barriers between the Spin Channel is an extra etching step. Furthermore, if the barrier is raised to form a partially thin channel portion above the oxide barrier for coupling the magnets, more complicated processes of etching and deposition are needed.

The manufacturing of spin device such as device 100 is also challenging. For example, intermixing of magnetic elements (such as Co, Fe, and Ni) into the Spin Channel produces local spin scattering in the Spin Channel. Spin scattering lowers the performance of device 100 because it lowers the degree of spin polarization of the current injected into the spin channel compared to the current in the ferromagnet. Also, traditional material stack used for manufacturing spin devices are incompatible to accommodate certain magnetic materials such as Heusler alloys.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

FIG. 8A-C illustrate band structures for majority and minority spins of Heusler alloy.

DETAILED DESCRIPTION

Figure 1:
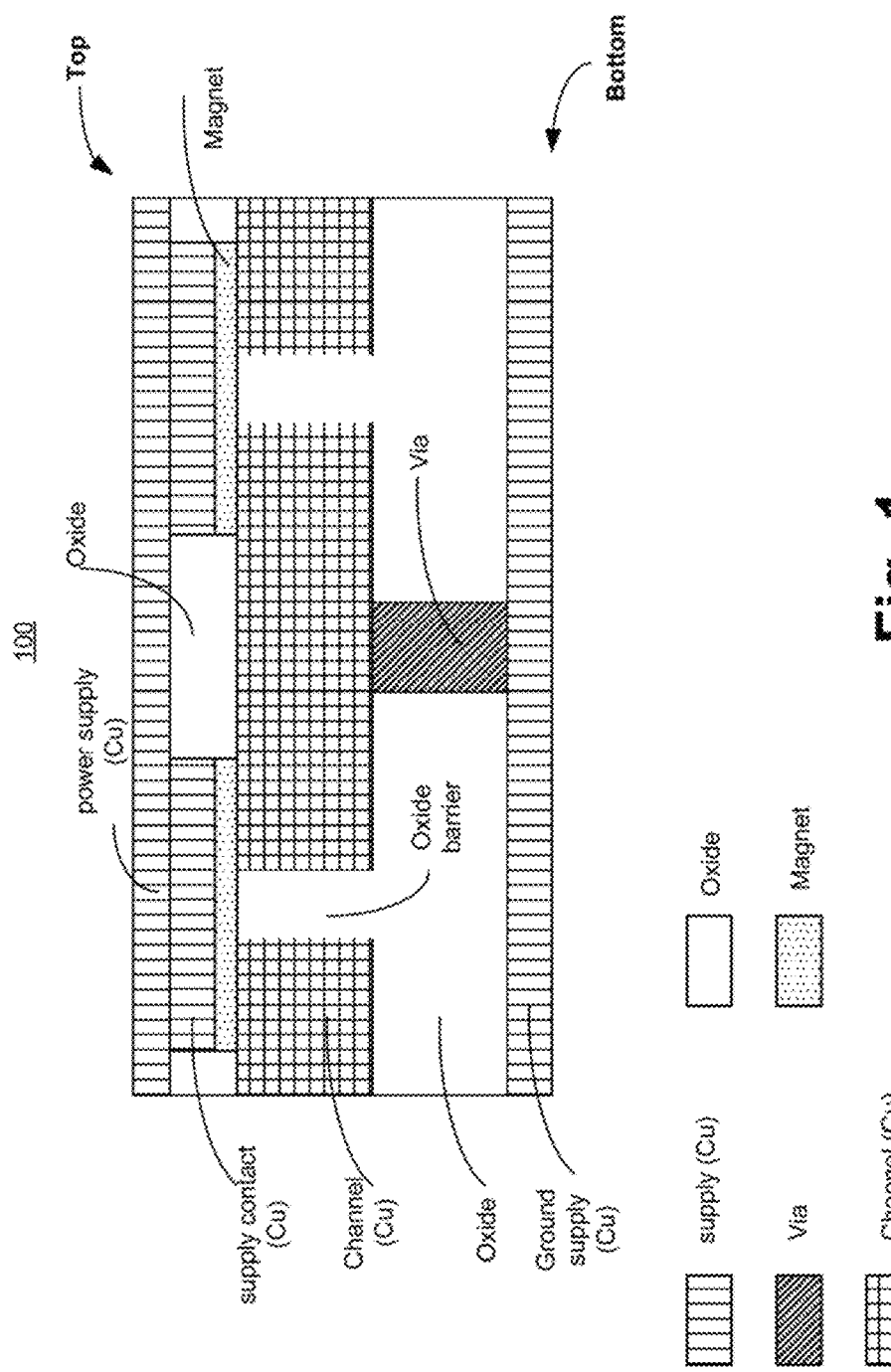
FIG. 1 illustrates a typical spin logic device with stacking of magnets above a spin channel.

Some embodiments describe a spin logic device and a corresponding fabricating method such that the device increases its switching speed and decreases energy per operation of Spin Transfer Torque (STT). In some embodiments, magnetic contacts for the device are formed with high anisotropy ($H_k$) and low magnetic saturation ($M_s$) materials comprising Heusler alloys. Heusler alloys are ferromagnetic metal alloys based on Heusler phase. Heusler phases are intermetallics with particular composition and face-centered cubic crystal structure. Heusler alloys are ferromagnetic because of the double-exchange mechanism between neighboring magnetic ions. The neighboring magnetic ions are usually manganese ions, which sit at the body centers of the cubic structure and carry most of the magnetic moment of the alloy.

Some embodiments use engineered interfaces between the Heusler alloys and the spin channel. In some embodiments, these engineered interfaces are formed of atomistic crystalline matched layers such as layers of Ag. In some embodiments, the engineered interfaces are designed such that they operate as mechanical barriers to stop inter-diffusion between the magnets and the spin channels. Some embodiments provide a matched or sufficiently matched (e.g., matched within 4%) spin transfer layer to achieve high spin injection efficiency for spin transfer from the magnetic contact into the spin channel. Some embodiments use an inverted structure (i.e., inverted compared to device 100 of FIG. 1) to enable the fabrication of a spin device using Heusler alloys and for matching layer via the use of an in situ processing flow.

There are many technical effects of the various embodiments. For example, the fabricating method of the device of some embodiments enables natural templating of Heusler alloy based nanomagnets which result in high performing devices (i.e., devices with higher spin injection efficiency than the spin injection efficiency of device 100 of FIG. 1). The device of various embodiments enables improved spin diffusion length and spin injection by suppressing the inter-diffusion of magnetic elements from the ferromagnet into the spin channels. The device of some embodiments exhibits improved switching speeds and lower energy compared to device 100 of FIG. 1 due to higher magnetic anisotropy and lower magnetic saturation of the nanomagnets. The structure of the device of various embodiments also enables integration of new magnetic materials on customized templates for forming Heusler alloy injector and detector magnets. Other technical effects will be evidence from the various embodiments described here.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct physical, electrical, or wireless connection between the things that are connected, without any intermediary devices. The term "coupled" means either a direct electrical or wireless connection between the things that are connected or an indirect electrical or wireless connection through one or more passive or active intermediary devices. The term "circuit" means one or more passive and/or active components that are arranged to cooperate with one another to provide a desired function. The term "signal" means at least one current signal, voltage signal, magnetic signal, electromagnetic signal, or data/clock signal. The meaning of "a," "an," and "the" include plural references. The meaning of "in" includes "in" and "on."

The terms "substantially," "close," "approximately," "near," and "about," generally refer to being within +/−10% of a target value (unless specifically specified). Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

Figure 2:
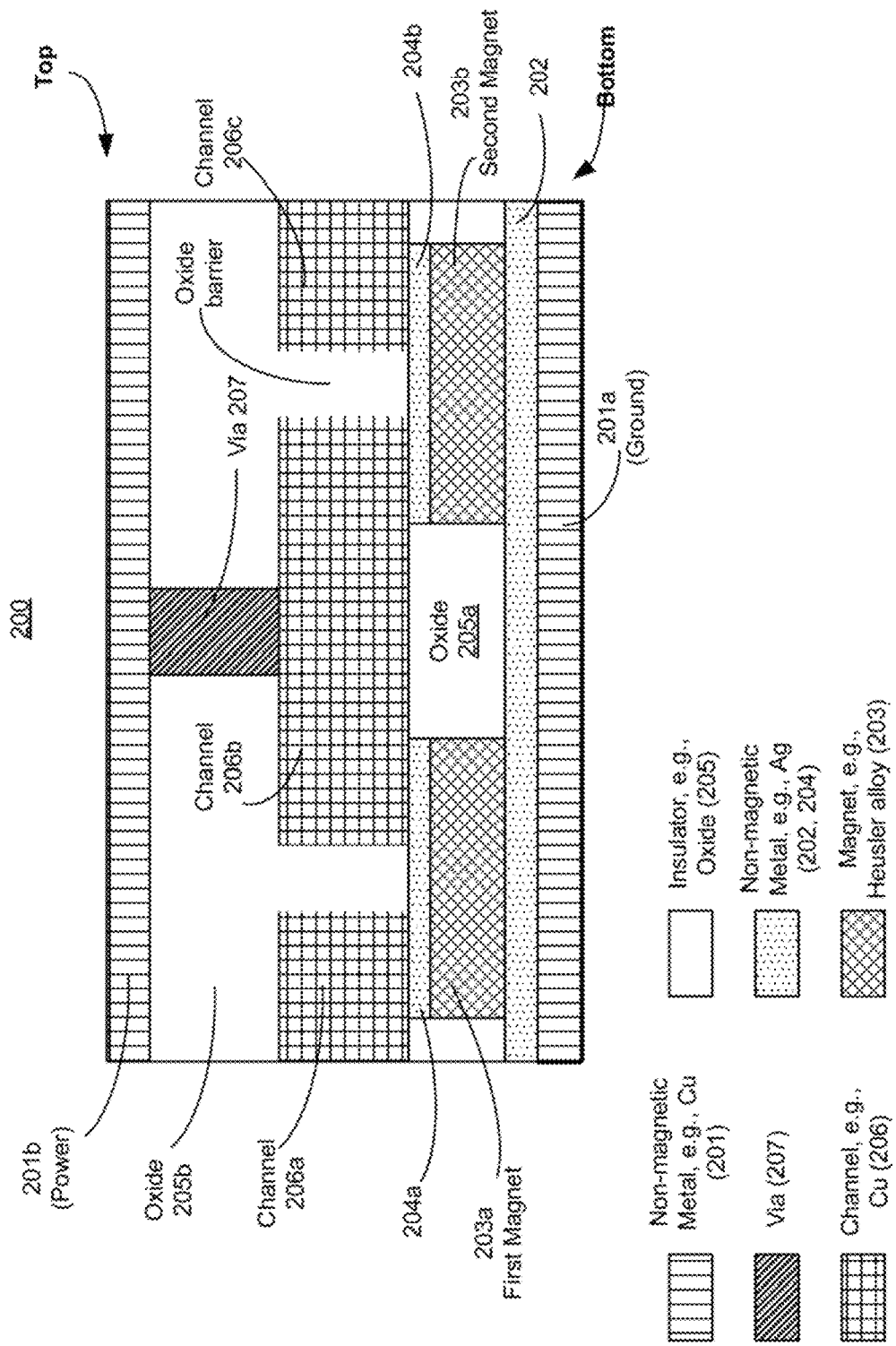
FIG. 2 illustrates a spin logic device with stacking of magnets below a spin channel and with matched spacer for improved spin injection, according to some embodiments of the disclosure.

FIG. 2 illustrates spin logic device 200 with stacking of magnets below a spin channel and with matched spacer for improved spin injection, according to some embodiments of the disclosure.

In some embodiments, device 200 comprises a first metal layer 201*a*, first interface 202 of non-magnetic material, First Magnet 203*a* formed with Heusler alloys, Second Magnet 203*b* also formed with Heusler alloys, Oxide 205*a* between First and Second Magnets 203*a/b*, second interface 204*a/b* over First and Second Magnets 203*a/b* respectively, Spin Channel 206*a/b/c*, Oxide layer 205*b* over Spin Channel 206*a/b/c*, Via 207, and second metal layer 201*b*. Here, Ground and Power metal layers 201*a* and 201*b*, respectively, may be collectively referred to as metal layers 201; First and Second Magnets 203*a* and 203*b*, respectively, may be collectively referred to as magnets 203; interface layers 204*a* and 204*b* may be collectively referred to as interface layers 204; Oxide 205*a* and 205*b* may be collectively referred to as oxide 205; and Spin Channel 206*a/b/c* may be collectively referred to as Spin Channel 206.

In some embodiments, the material(s) used for forming metal layers 201, Via 207, and Spin Channel 206 is/are the same. For example, Copper (Cu) can be used for forming metal layers 201, Via 207, and Spin Channel 206. In other embodiments, material(s) used for forming metal layers 201, Via 207, and Spin Channel 206 are different. For example, metal layers 201 may be formed of Cu while Via 207 may be formed of Tungsten (W). Any suitable metal or combination of metals can be used for forming metal layers 201, Via 207, and Spin Channel 206. For example, Spin Channel 206 can be formed of Silver (Ag), Aluminum (Al), Graphene, and other 2D materials.

In some embodiments, First and Second Magnets 203*a/b* are formed with high spin polarization materials. Heusler alloys are an example of high spin polarization materials. Heusler alloys are ferromagnetic because of double-exchange mechanism between neighboring magnetic ions. First and Second Magnets 203*a/b* are also referred to as First and Second Magnet contacts. First Magnet 203*a* is also referred to as the input magnet while Second Magnet 203*b* is also referred to as the output magnet. These labels are provided for purposes of describing the various embodiments, but do not change the structure of device 200.

In some embodiments, First and Second Magnets 203*a/b* are formed with a sufficiently high anisotropy ($H_k$) and sufficiently low magnetic saturation ($M_s$) to increase injection of spin currents. For example, Heusler alloys of high $H_k$ and low $M_s$ are used to form First and Second Magnets 203*a/b*. In the following embodiments, First and Second Magnets 203*a/b* are described as being Heusler alloys. However, in some embodiments, other magnetic materials exhibiting high $H_k$ and low $M_s$ may be used for forming First and Second Magnets 203*a/b*.

Magnetic saturation $M_s$ is generally the state reached when an increase in applied external magnetic field H cannot increase the magnetization of the material (i.e., total magnetic flux density B substantially levels off). Here, sufficiently low $M_s$ refers to $M_s$ less than 200 kA/m (kilo-Amperes per meter). Anisotropy $H_k$ generally refers to the material property which is directionally dependent. Materials with $H_k$ are materials with material properties that are highly directionally dependent. Here, sufficiently high $H_k$ in context of Heusler alloys is considered to be greater than 2000 Oe (Oersted). For example, a half metal that does not have bandgap in spin up states but does have bandgap in spin down states (i.e., at the energies within the bandgap, the material has 100% spin up electrons). If the Fermi level of the material is in the bandgap, injected electrons will be close to 100% spin polarized. In this context, "spin up" generally refers to the positive direction of magnetization, and "spin down" generally refers to the negative direction of magnetization. Variations of the magnetization direction (e.g. due to thermal fluctuations) result in mixing of spin polarizations.

In some embodiments, Heusler alloys such as $Co_2FeAl$ and $Co_2FeGeGa$ are used for forming First and Second Magnets 203a/b. Other examples of Heusler alloys include: $Cu_2MnAl$, $Cu_2MnIn$, $Cu_2MnSn$, $Ni_2MnAl$, $Ni_2MnIn$, $Ni_2MnSn$, $Ni_2MnSb$, $Ni_2MnGa$, $Co_2MnAl$, $Co_2MnSi$, $Co_2MnGa$, $Co_2MnGe$, $Pd_2MnAl$, $Pd_2MnIn$, $Pd_2MnSn$, $Pd_2MnSb$, $Co_2FeSi$, $Fe_2VAl$, $Mn_2VGa$, $Co_2FeGe$, etc.

In some embodiments, engineered interfaces (i.e., first and second interfaces 204a/b and 202, respectively) are formed between the magnets (i.e., First and Second Magnets 203a/b) and metal layers (e.g., Ground 201a and Spin Channel 206a). In some embodiments, the dimensions (width, length, and height/thickness) of Ground 201a is chosen to optimize (i.e., reduce) the energy-delay of spin device 200. In some embodiments, first and second interfaces 204a/b and 202, respectively, are formed of non-magnetic material(s) such that the interface layers and the magnets together have sufficiently matched atomistic crystalline layers. For example, the non-magnetic material has a crystal periodicity which is matched through rotation or by mixing of elements.

Here, sufficiently matched atomistic crystalline layers refer to matching of the lattice constant 'a' within a threshold level above which atoms exhibit dislocation which is harmful to the device (i.e., the number and character of dislocations lead to a significant (e.g., greater than 10%) probability of spin flip while an electron traverses the interface layer). For example, the threshold level is within 5% (i.e., threshold levels in the range of 0% to 5% of the relative difference of the lattice constants). As the matching improves (i.e., matching gets closer to perfect matching), spin injection efficiency from spin transfer from magnets 203 to Spin Channel 206 increases. Poor matching (i.e., matching worse than 5%) implies dislocation of atoms that is harmful for the device. In some embodiments, the non-magnetic material is Ag with a crystal lattice constant a=4.05 A which is matched to Heusler alloys CFA (i.e., $Co_2FeAl$) and CFGG (i.e., $Co_2FeGeGa$ with a=5.737 A) provided the direction of the crystal axes is turned by 45 degrees. Then the projection of the lattice constant is expressed as:

$$a/\sqrt{2} \approx 5.737 \text{ A}/1.414 \approx 4.057 \text{ A}$$

As such, the magnetic structure stack (e.g., stack of 203a and 204a) allows for interfacial matching of Heusler alloys interfaces with the spin channel. In some embodiments, the stack also allows for templating of the bottom surface of the Heusler alloy.

In some embodiments, interface layer 202 (e.g., Ag) provides electrical contact to magnets 203. As such, a template is provided with the right crystal orientation to seed the formation of the Heusler alloy (which forms magnets 203). In some embodiments, the directionality of spin logic may be set by the geometric asymmetry in spin device 200. In some embodiments, the area of overlap of First magnet 203a (e.g., the input magnet) with Spin Channel 206b is larger than the area of overlap of Second magnet 203b (e.g., the output magnet) causing asymmetric spin in channel 206b.

One technical effect of the engineered interface layers 204a/b (e.g., Ag) between Heusler alloy based magnets 203 and Spin Channel 206 is that it provides for higher mechanical barrier to stop or inhibit the inter-diffusion of magnetic species with Spin Channel 206. In some embodiments, the engineered interface layers 204 maintain high spin injection at the interface between Spin Channel 206 and magnets 203. As such, engineered interface layers 204 improve the performance of spin device 200.

In some embodiments, Spin Channel 206 is partitioned into segments 206a, 206b, and 206c such that Oxide 205b forms a barrier between the channel segments. One purpose of the barrier is to control the transfer of spin to charge. In some embodiments, the gap between First and Second Magnets 203a/b, provided by Oxide 205b, is chosen to be sufficient to permit isolation of the two magnets 203. In some embodiments, a layer of oxide 205b is deposited over Spin Channel 206 and then a via hole is etched for Via 207. In some embodiments, Via 207 couples Channel segment 206b to Power supply layer 201b which is formed over Oxide layer 205b.

The embodiment of FIG. 2 is inverted compared to device 100 of FIG. 1. For example, magnetic contacts 203 of device 200 are placed below Spin Channel 206. As such, magnetic contacts 203 are closer to the bottom than the top. Conversely, the magnets of device 100 are closer to the top than the bottom. In some embodiments, the fabrication of Heusler alloy and the matching layer is via the use of an in situ processing flow. Here, in situ processing flow refers to a fabricating processing flow that does not break vacuum. As such, oxidation on interface 204 are avoided resulting in smooth surfaces at interface 204. The process of fabricating the inverted device 200 allows for templating of Heusler alloy for appropriate crystal structure. The process of fabricating device 200 also allows for easier formation of oxide insulation/barrier between the spin channels belonging to separate spin devices.

Figure 3:
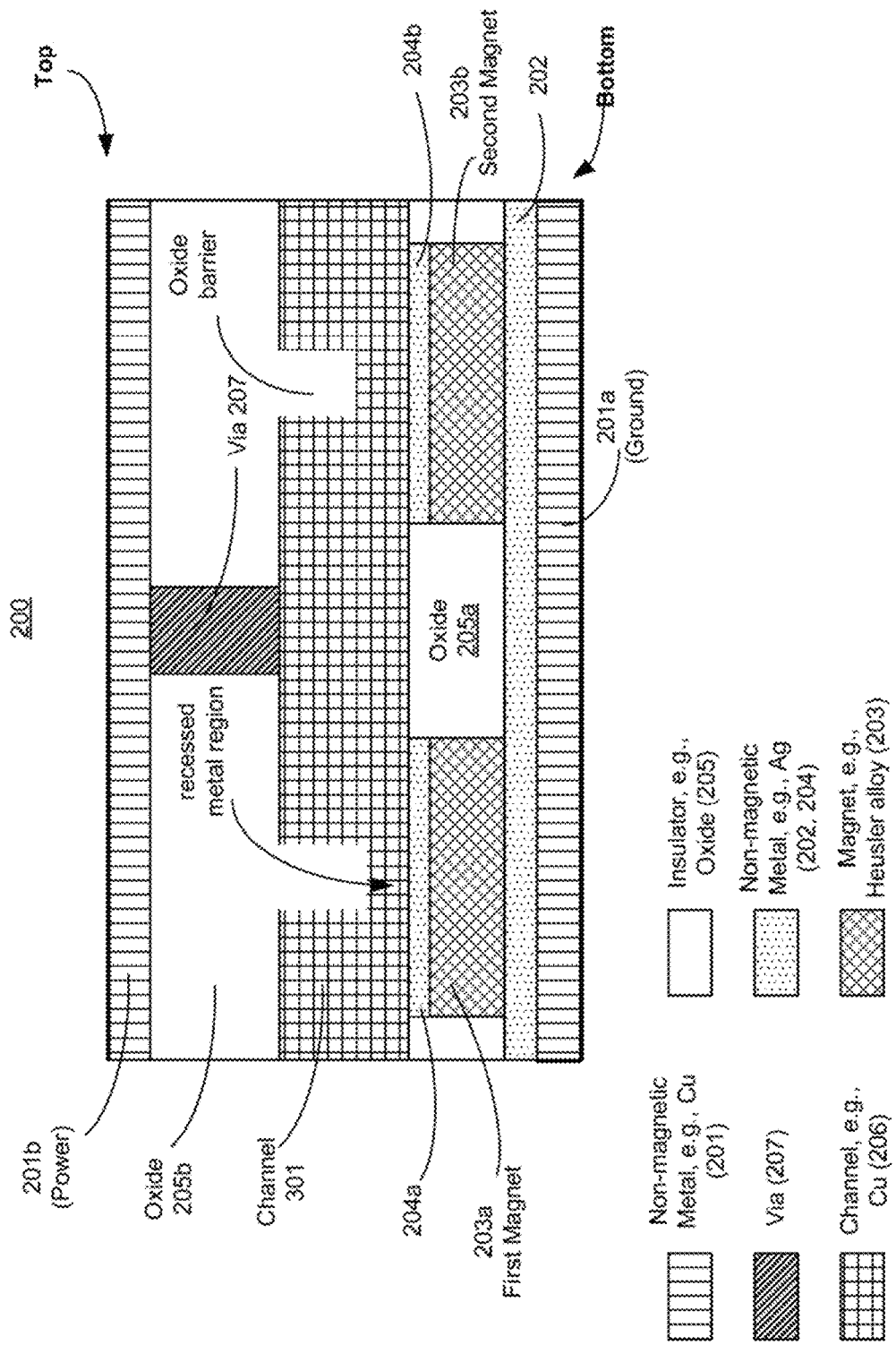
FIG. 3 illustrates a spin logic device with stacking of magnets below a spin channel with matched spacer for improved spin injection, according to some other embodiments of the disclosure.

FIG. 3 illustrates spin logic device 300 with stacking of magnets below a spin channel with matched spacer for improved spin injection, according to some other embodiments of the disclosure. It is pointed out that those elements of FIG. 3 having the same reference numbers (or names) as the elements of any other figure can operate or function in any manner similar to that described, but are not limited to such. So as not to obscure the embodiments, differences between spin logic devices of FIG. 3 and FIG. 2 are described.

FIG. 3 is similar to FIG. 2 except that Oxide barriers 205b are not complete barriers between segments of Spin Channel 206. As such, Spin Channel 301 has sections of metal below Oxide barriers 205b for coupling the channel segments. One reason for having recessed metal region under Oxide barriers 205b is to control the rate of exchange of spin between channel segments. In some embodiments, the height or thickness of the recessed metal region controls the rate of exchange of spin. For example, the thicker the recessed metal region (i.e., lesser the metal recession) the higher the rate of exchange of spin. The embodiment of FIG. 3 provides an alternative way of connecting spin devices. In some embodiments, spin logic devices 200/300 are integrated to form majority gate spin logic devices.

Figure 4:
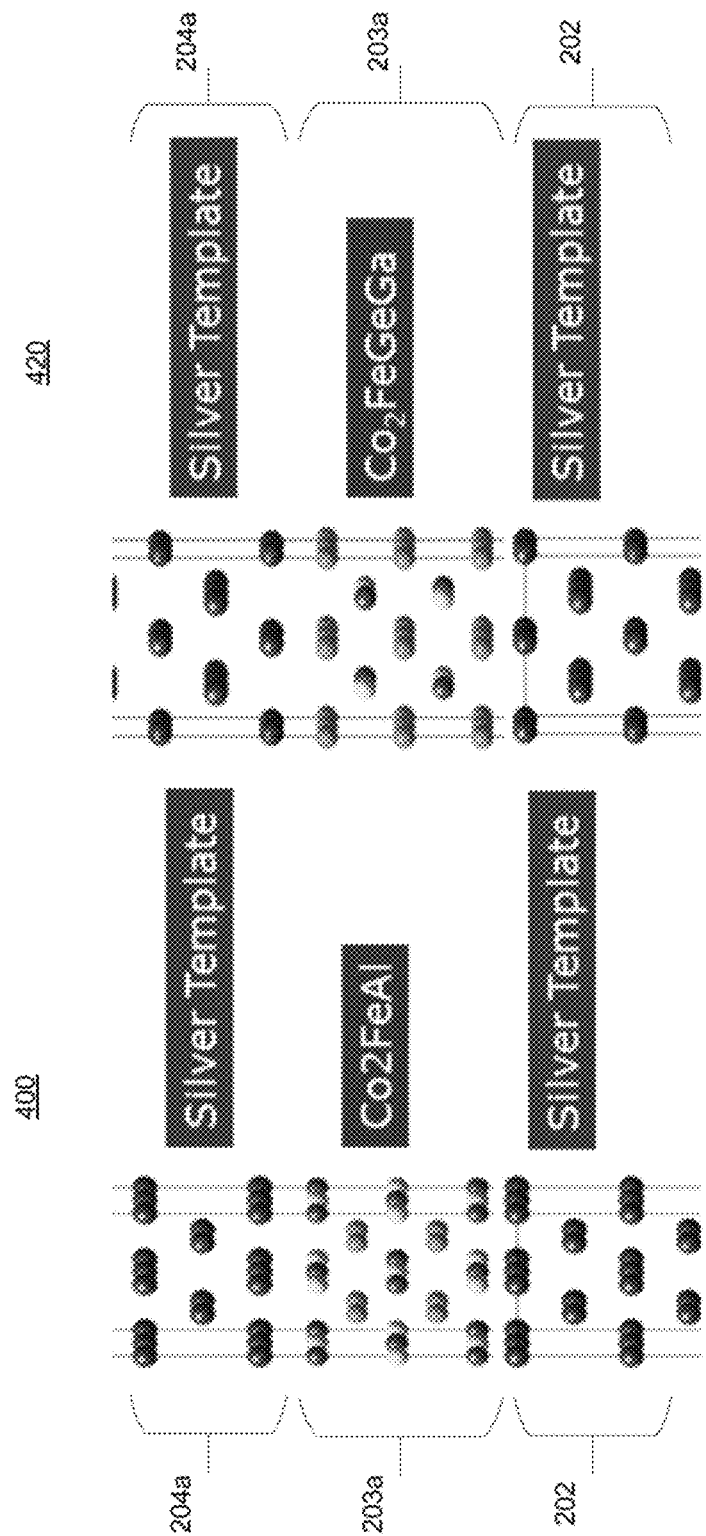
FIGS. 4A-B illustrate proposed stacks for spin logic devices showing atomic templating of Heusler alloys for generating atomistic crystalline matched layers, according to some embodiments of the disclosure.

FIGS. 4A-B illustrate proposed stacks 400 and 420 for spin logic devices showing atomic templating of Heusler alloys for generating atomistic crystalline matched layers, according to some embodiments of the disclosure. It is pointed out that those elements of FIGS. 4A-B having the same reference numbers (or names) as the elements of any other figure can operate or function in any manner similar to that described, but are not limited to such.

Stacks 400 and 420 illustrate a naturally templated magnet using the magnetic structure of some embodiments. A characteristic of templated stacks is that the crystalline growth of a layer is not adversely affected by the crystal symmetry of the underlying layer. For example, it is known that to get a conformal crystalline growth of MgO (001) on top of Ru (111) is extremely difficult and hence Ru (111) serves as a bad template. Stacks 400 and 420 are a stack of interface layer 202 (e.g., Ag), magnet layer 203a/b (e.g., Heusler alloy), and interface layer 203a/b (e.g., Ag). Stack 400 shows matching of Ag with $Co_2FeAl$ while stack 420 shows matching of Ag with $Co_2FeGeGa$. Here, there is a 2% difference in crystal periodicity which makes the interface between Ag with $Co_2FeAl$, and Ag with $Co_2FeGeGa$, well matched (i.e., Ag has a crystal periodicity which is matched well with the magnet through in-plane rotation).

Figure 5:
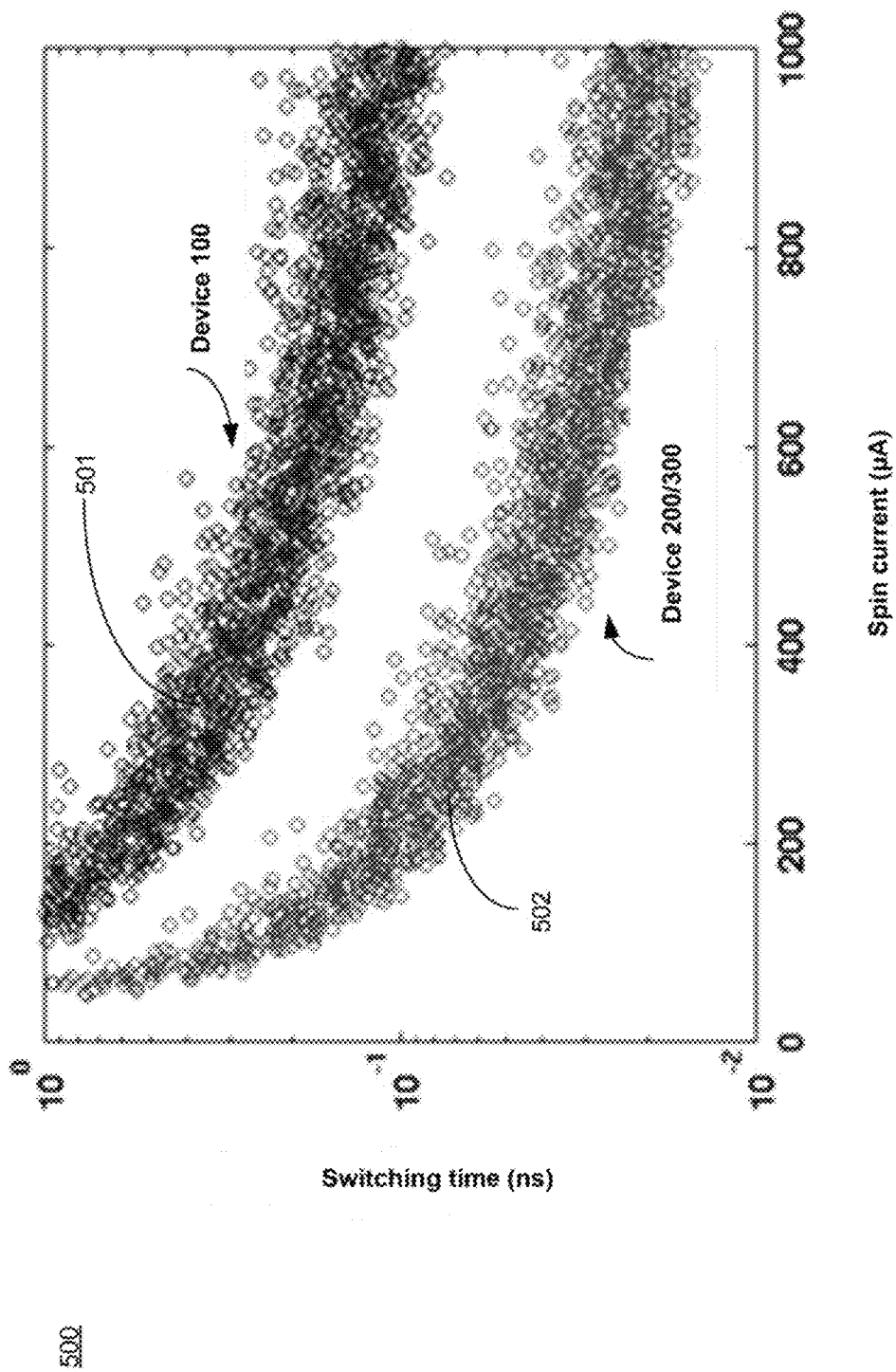
FIG. 5 illustrates a plot showing spin torque switching with the proposed stack compared to stacks with perpendicular magnet anisotropy, according to some embodiments of the disclosure.

FIG. 5 illustrates plot 500 showing spin torque switching with the stack using Heusler alloy and the engineered interface for atomic crystalline matching compared to stacks perpendicular magnet anisotropy, according to some embodiments of the disclosure. It is pointed out that those elements of FIG. 5 having the same reference numbers (or names) as the elements of any other figure can operate or function in any manner similar to that described, but are not limited to such. Here, x-axis is spin current in microamperes (μA) and y-axis is switching time in nanoseconds (ns).

Plot 500 shows two types of data—501 and 502. Magnetic stack 501 is a traditional magnetic stack made from perpendicular magnet anisotropy (PMA) while magnetic stack 502 is an in-plane magnet using Heusler alloy and the engineered interface for atomic crystalline matching. Here, magnetic stack 502 has higher $H_k$ (e.g., 10 kOe for stack 502 compared to 1 kOe for stack 501) and reduced magnetic anisotropy (e.g., less than 200 kA/m compared to $10^6$ MA/m for CoFe used in PMA). Plot 500 illustrates that the performance of magnetic stack 502 provides faster switching or switching with smaller current compared to traditional stack 501, according to some embodiments.

Figure 6:
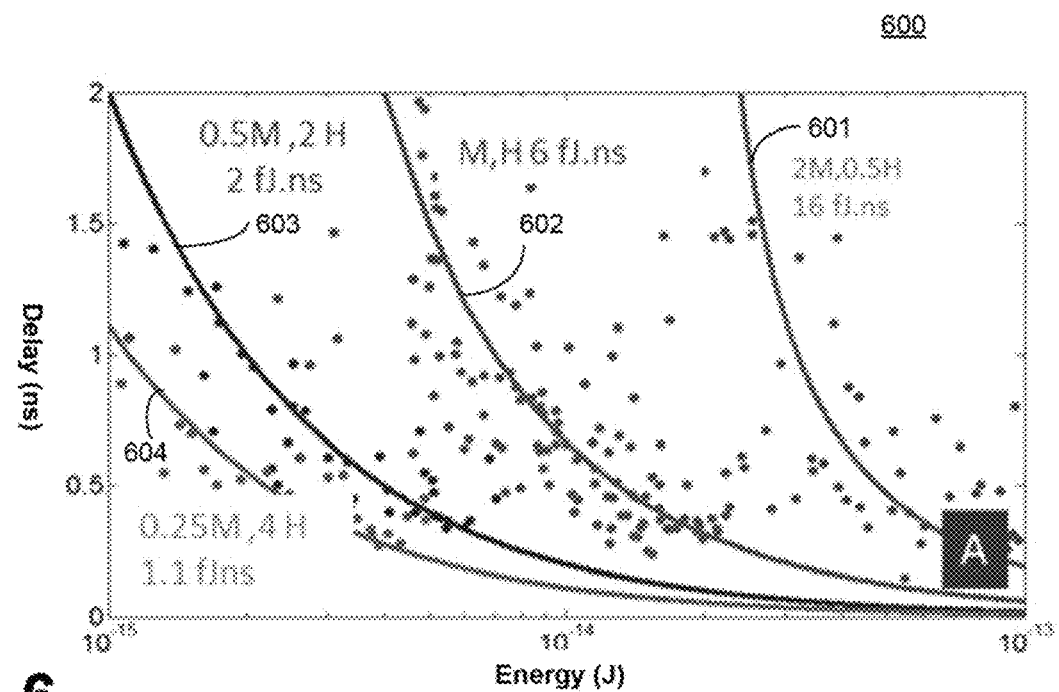
FIG. 6 illustrates a plot showing the effects of Heusler alloys on energy and delay of a spin logic device, according to some embodiments of the disclosure.

FIG. 6 illustrates plot 600 showing effects of Heusler alloys on energy and delay of spin logic device 200/300, according to some embodiments of the disclosure. It is pointed out that those elements of FIG. 6 having the same reference numbers (or names) as the elements of any other figure can operate or function in any manner similar to that described, but are not limited to such. Here, x-axis is Energy (in Joules J) and y-axis is Delay (in ns).

Four cases are shown labeled as 601, 602, 603, and 604. For each case, the product of $M_s$ and $H_k$ is kept constant to keep the energy barrier at a certain value to guard against thermal fluctuations. Case 601 uses $2M_s$ and $0.5H_k$ and requires higher energy than other cases for the same delay. For case 601, the energy-delay product is 16 fJ·ns. Case 602 uses $1M_s$ and $1H_k$ with energy-delay product of 6 fJ·ns. Case 603 uses $0.5M_s$ and $2H_k$ with energy-delay product of 2 fJ·ns. Case 604 uses $0.25M_s$ and $4H_k$ with energy-delay product of 1.1 fJ·ns. Plot 600 shows the effects of lower $M_s$ and higher $H_k$ on the energy-delay product. In some embodiments, the energy-delay product improves (i.e., reduces) using higher $H_k$ and lower $M_s$ as with Heusler alloy magnetic materials (e.g., $Co_2FeAl$ and $Co_2FeGeGa$).

Figure 7:
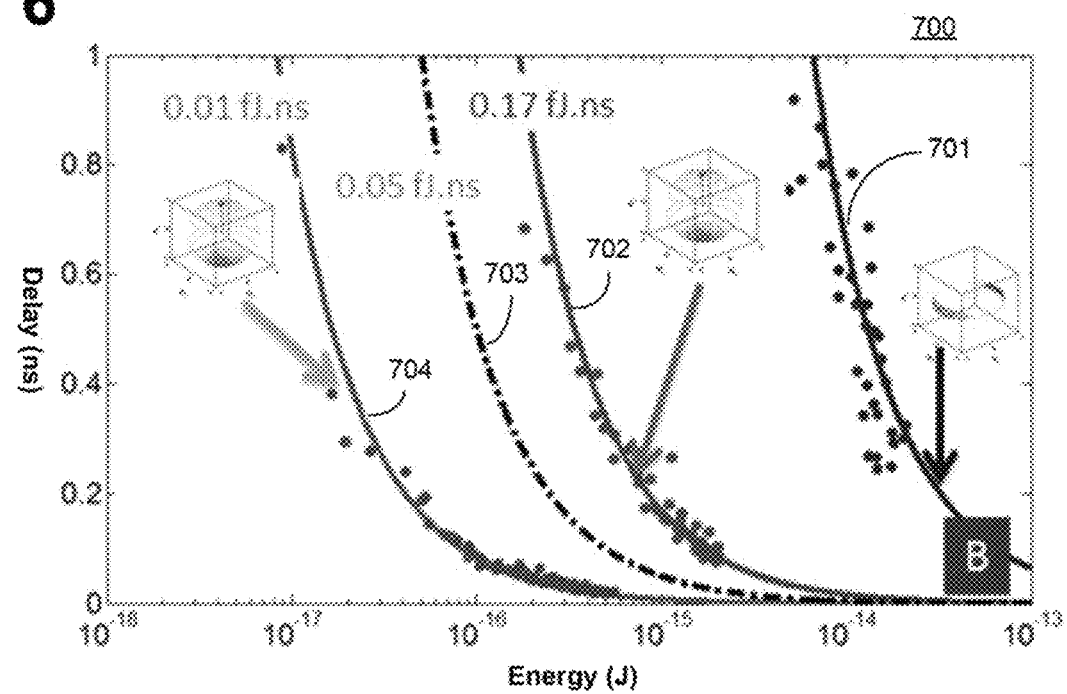
FIG. 7 illustrates a plot comparing the energy-delay relationship for different types of devices including a device using Heusler alloys for its spin logic device, according to some embodiments of the disclosure.

FIG. 7 illustrates plot 700 comparing the energy-delay relationship for different types of devices including a device using Heusler alloys for its spin logic device, according to some embodiments of the disclosure. It is pointed out that those elements of FIG. 7 having the same reference numbers (or names) as the elements of any other figure can operate or function in any manner similar to that described, but are not limited to such. Here, x-axis is Energy (in Joules J) and y-axis is Delay (in ns).

Four cases are shown labeled as 701, 702, 703, and 704. Case 701 is an energy-delay curve for an in-plane ferromagnet. Case 702 is an energy-delay curve for a PMA ferromagnet. Case 703 is an energy-delay curve for a 20 nm sub-threshold low-power CMOS device. Case 704 is an energy-delay curve for ferromagnets using higher $H_k$ and lower $M_s$ as with Heusler alloy magnetic materials, according to some embodiments.

Table 1 shows the performance of spin logic device 200/300 against traditional spin logic devices made from in-plane and PMA magnets.

TABLE 1

Energy-delay comparison

| | | In-plane | PMA | Heusler PMA spin device 200 |
|---|---|---|---|---|
| Energy-delay | aJ · ns | 6400 | 170 | 10 |
| $M_s$ | A/m | $10^6$ | $10^6$ | $250 \times 10^3$ |
| $H_k$ | A/m | $3 \times 10^4$ | $4 \times 10^4$ | $16 \times 10^4$ |

The four cases of plot 700 and Table 1 illustrate that the energy-delay curves for ferromagnets using higher $H_k$ and lower $M_s$, as with Heusler alloy magnetic materials, is far better (i.e., smaller) than energy-delay curves for other cases.

The improvement in energy-delay product (i.e., lower energy and delay) is because of the improved nanomagnets dynamics. The transient spin dynamics and transport of lateral spin logic device 200 can be simulated using vector spin circuit models coupled with nanomagnets dynamics. As such, the operation of spin logic device 200/300 can be verified using multi-physics simulation which treats the nanomagnets as single magnetic moments and uses spin circuit theory to calculate the scalar voltage and vector spin voltages.

The dynamics of nanomagnets can be described by Landau-Lifshitz-Gilbert equations:

$$\frac{\partial m_1}{\partial t} = -\gamma\mu_0[m_1 \times \overline{H}_{\mathit{eff}}] + \alpha\left[m_1 \times \frac{\partial m_1}{\partial t}\right] - \frac{\overline{I}_{s1}}{eN_s}$$

$$\frac{\partial m_2}{\partial t} = -\gamma\mu_0[m_2 \times \overline{H}_{\mathit{eff}}] + \alpha\left[m_2 \times \frac{\partial m_2}{\partial t}\right] - \frac{\overline{I}_{s2}}{eN_s}$$

Here, $\overline{I}_{s1}$ and $\overline{I}_{s2}$ are the projections perpendicular to magnetizations of the spin polarized currents entering the two free nanomagnets—First and Second Free Magnet layers 203a/b, respectively. These projections are derived from the spin-circuit analysis. The effective magnetic field $\overline{H}_{\mathit{eff}}$ originating from shape and material anisotropy, and the Gilbert damping constant 'α' are the properties of the magnets. The spin currents are obtained from a vector transport model for the magnetic stack. Here, $m_1$ and $m_2$ are magnetization vectors of the First and Second Free Magnet layers 203a/b, respectively, $N_s$ is the number of spins in each of First and Second Free Magnet layers 203a/b. In some embodiments, the spin equivalent circuit comprises a tensor spin conduction matrix governed by the present conduction of the magnet. In one embodiment, a self-consistent stochastic solver is used to account for thermal noise of the magnets.

Figures 8A, 8B:
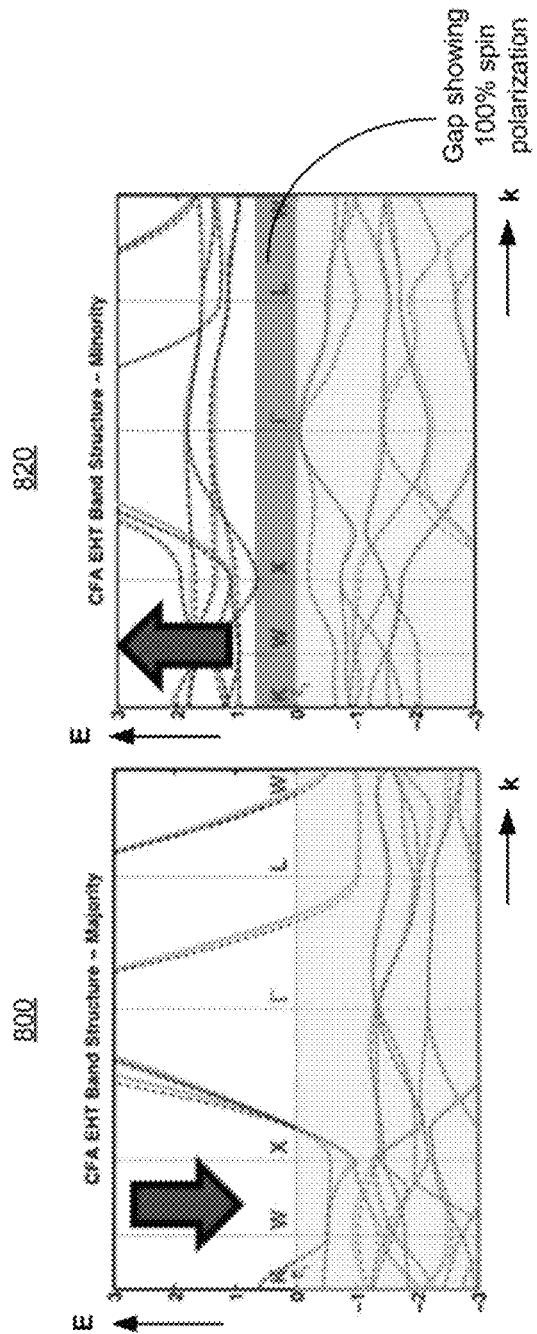

FIGS. 8A-B illustrate band structures 800 and 820 for majority and minority spins of Heusler alloy, respectively. It is pointed out that those elements of FIGS. 8A-B having the same reference numbers (or names) as the elements of any other figure can operate or function in any manner similar to that described, but are not limited to such. Band structures 800 and 820 illustrate that Heusler alloys produce high spin polarization due to the unique band structure which produces a bandgap for minority spin of the magnet. The minority spin has a bandgap which produces a high spin polarization at room temperature.

Figure 9:
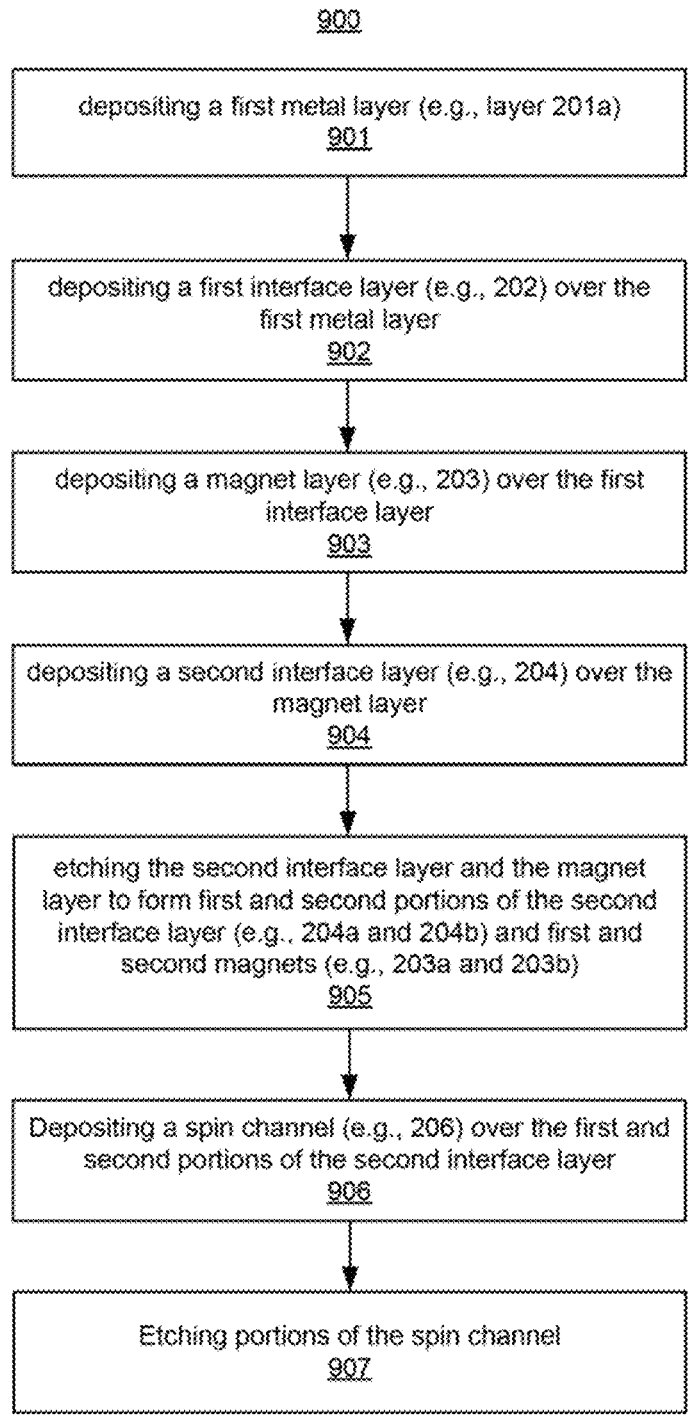
FIG. 9 illustrates a flowchart of a method for fabricating a spin logic device with stacking of magnets below a spin channel and with matched spacer for improved spin injection, according to some embodiments of the disclosure.

FIG. 9 illustrates flowchart 900 of a method for fabricating spin logic device 200 with stacking of magnets below a spin channel and with matched spacer for improved spin injection, according to some embodiments of the disclosure. It is pointed out that those elements of FIG. 9 having the same reference numbers (or names) as the elements of any other figure can operate or function in any manner similar to that described, but are not limited to such.

Although the blocks in the flowchart with reference to FIG. 9 are shown in a particular order, the order of the actions can be modified. Thus, the illustrated embodiments can be performed in a different order, and some actions/blocks may be performed in parallel. Some of the blocks and/or operations listed in FIG. 9 are optional in accordance with certain embodiments. The numbering of the blocks presented is for the sake of clarity and is not intended to prescribe an order of operations in which the various blocks must occur. Additionally, operations from the various flows may be utilized in a variety of combinations.

At block 901, first metal layer 201a is deposited. In some embodiments, first metal layer 201a is coupled to ground to provide ground supply to device 200. At block 902, first interface layer 202 is deposited over first metal layer 201a. In some embodiments, first interface layer 202 is formed of a non-magnetic material (e.g., Ag). At block 903, a magnet layer 203 (before being etched to form input and output magnets 203a/b) is deposited over first interface layer 202. In some embodiments, magnet layer 203 is formed of a material with a sufficiently high anisotropy and sufficiently low magnetic saturation to increase injection of spin currents.

At block 904, a second interface layer 204 (before being etched to form first and second interface layers 204a/b) is deposited over magnet layer 203 such that magnet layer 203 is sandwiched between the first and second interface layers 202 and 204. In some embodiments, first and second interface layers 201a and 204 respectively are formed of non-magnetic material such that the interface layers and magnet layers 203 together have sufficiently matched atomistic crystalline layers.

In some embodiments, the processes of blocks 901, 902, 903, and 904 are perform in situ (i.e., the fabrication processes do not break vacuum). As such oxidization between interfaces of the layers 201, 202, 203, and 204 is avoided (i.e., smooth interface surfaces are achieved). Smooth interface surfaces of the layers 201, 202, 203, and 204 allow for higher spin injection efficiency, according to some embodiments.

In some embodiments, magnet layer 203 is patterned to form First and Second Magnets 203a and 203b. This process breaks vacuum. For example, a photo-resist material is deposited over second interface layer 204 and then etched for forming a patterned photo-resist layer, where the pattern indicates future locations of First and Second Magnets 203a/b. At block 905, second interface layer 204 and magnet layer 203 are selectively etched using the patterned photo-resist to form first and second portions 204a/b of second interface layer 203. As such, First and Second Magnets 204a/b are also formed. In some embodiments, the etching stops above first interface layer 202. The photo-resist material is then removed.

At block 906, Spin Channel 206 (e.g., metal layer) is deposited over first and second portions 204a/b of second interface layer 204. In some embodiments, Spin Channel 206 is patterned into segments 206a/b/c by photo-resist deposition and patterning of the photo-resist material. At block 907, portions of Spin Channel 206 are etched to form segments of Spin Channel 206/a/b/c. Depending on whether device 200 or device 300 is being formed, the depth of etching of Spin Channel 206 is adjusted. In some embodiments, the method further comprises filing the etched portions with an insulator (e.g., Oxide 205b). In some embodiments, Oxide 205b is etched to form a via hole which is then filled with a metal to form Via 207 such that it couples Spin Channel 206b at one end of Via 207. In some embodiments, a second metal layer 201b is deposited over Oxide 206b to make contact with the other end of Via 207. In some embodiments, second metal layer 201b is coupled to a Power supply.

Figure 10:
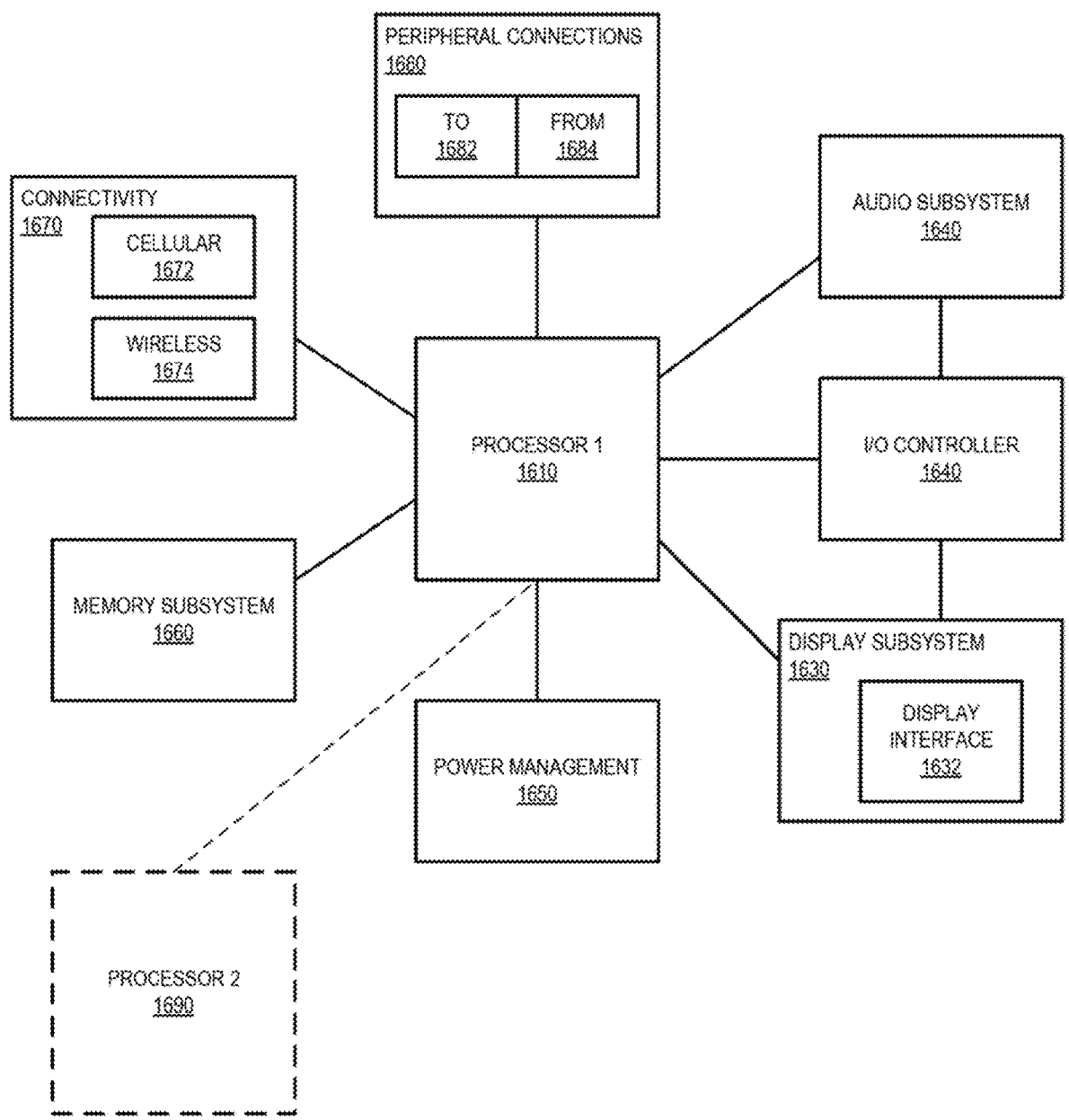
FIG. 10 illustrates a smart device or a computer system or a SoC (System-on-Chip) with a spin logic device with stacking of magnets below a spin channel and with matched spacer for improved spin injection, according to some embodiments of the disclosure.

FIG. 10 illustrates a smart device or a computer system or a SoC (System-on-Chip) with a spin logic device (e.g., 200/300) with stacking of magnets below a spin channel and with matched spacer for improved spin injection, according to some embodiments of the disclosure. Spin logic devices (e.g., 200/300) can be used for making high density embedded memory to improve performance of computer system. Spin logic devices (e.g., 200/300) an also be used to form non-volatile logic components to enable improved power and performance optimization. As such, battery life for the smart device of computer system can improve (i.e., last longer). It is pointed out that those elements of FIG. 10 having the same reference numbers (or names) as the elements of any other figure can operate or function in any manner similar to that described, but are not limited to such.

FIG. 10 illustrates a block diagram of an embodiment of a mobile device in which flat surface interface connectors could be used. In some embodiments, computing device 1600 represents a mobile computing device, such as a computing tablet, a mobile phone or smart-phone, a wireless-enabled e-reader, or other wireless mobile device. It will be understood that certain components are shown generally, and not all components of such a device are shown in computing device 1600.

For purposes of the embodiments, the transistors in various circuits and logic blocks described here are metal oxide semiconductor (MOS) transistors, which include drain, source, gate, and bulk terminals. The transistors also include Tri-Gate and FinFET transistors, Gate All Around Cylindrical Transistors, Tunneling FET (TFET), Square Wire, or Rectangular Ribbon Transistors or other devices implementing transistor functionality like carbon nanotubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bipolar junction transistors—BJT PNP/NPN, BiCMOS, CMOS, eFET, etc., may be used without departing from the scope of the disclosure.

In some embodiments, computing device 1600 includes first processor 1610 with a spin logic device (e.g., 200/300) with stacking of magnets below a spin channel and with matched spacer for improved spin injection, according to some embodiments discussed. Other blocks of the computing device 1600 may also include a spin logic device with stacking of magnets below a spin channel and with matched spacer for improved spin injection, according to some embodiments. The various embodiments of the present disclosure may also comprise a network interface within 1670 such as a wireless interface so that a system embodiment may be incorporated into a wireless device, for example, cell phone or personal digital assistant.

In some embodiments, processor 1610 (and/or processor 1690) can include one or more physical devices, such as microprocessors, application processors, microcontrollers, programmable logic devices, or other processing means. The processing operations performed by processor 1610 include the execution of an operating platform or operating system on which applications and/or device functions are executed. The processing operations include operations related to I/O (input/output) with a human user or with other devices, operations related to power management, and/or operations related to connecting the computing device 1600 to another device. The processing operations may also include operations related to audio I/O and/or display I/O.

In some embodiments, computing device 1600 includes audio subsystem 1620, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 1600, or connected to the computing device 1600. In one embodiment, a user interacts with the computing device 1600 by providing audio commands that are received and processed by processor 1610.

In some embodiments, computing device 1600 comprises display subsystem 1630. Display subsystem 1630 represents hardware (e.g., display devices) and software (e.g., drivers) components that provide a visual and/or tactile display for a user to interact with the computing device 1600. Display subsystem 1630 includes display interface 1632, which includes the particular screen or hardware device used to provide a display to a user. In one embodiment, display interface 1632 includes logic separate from processor 1610 to perform at least some processing related to the display. In one embodiment, display subsystem 1630 includes a touch screen (or touch pad) device that provides both output and input to a user.

In some embodiments, computing device 1600 comprises I/O controller 1640. I/O controller 1640 represents hardware devices and software components related to interaction with a user. I/O controller 1640 is operable to manage hardware that is part of audio subsystem 1620 and/or display subsystem 1630. Additionally, I/O controller 1640 illustrates a connection point for additional devices that connect to computing device 1600 through which a user might interact with the system. For example, devices that can be attached to the computing device 1600 might include microphone devices, speaker or stereo systems, video systems or other display devices, keyboard or keypad devices, or other I/O devices for use with specific applications such as card readers or other devices.

As mentioned above, I/O controller 1640 can interact with audio subsystem 1620 and/or display subsystem 1630. For example, input through a microphone or other audio device can provide input or commands for one or more applications or functions of the computing device 1600. Additionally, audio output can be provided instead of, or in addition to display output. In another example, if display subsystem 1630 includes a touch screen, the display device also acts as an input device, which can be at least partially managed by I/O controller 1640. There can also be additional buttons or switches on the computing device 1600 to provide I/O functions managed by I/O controller 1640.

In some embodiments, I/O controller 1640 manages devices such as accelerometers, cameras, light sensors or other environmental sensors, or other hardware that can be included in the computing device 1600. The input can be part of direct user interaction, as well as providing environmental input to the system to influence its operations (such as filtering for noise, adjusting displays for brightness detection, applying a flash for a camera, or other features).

In some embodiments, computing device 1600 includes power management 1650 that manages battery power usage, charging of the battery, and features related to power saving operation. Memory subsystem 1660 includes memory devices for storing information in computing device 1600. Memory can include nonvolatile (state does not change if power to the memory device is interrupted) and/or volatile (state is indeterminate if power to the memory device is interrupted) memory devices. Memory subsystem 1660 can store application data, user data, music, photos, documents, or other data, as well as system data (whether long-term or temporary) related to the execution of the applications and functions of the computing device 1600.

Elements of embodiments are also provided as a machine-readable medium (e.g., memory 1660) for storing the computer-executable instructions (e.g., instructions to implement any other processes discussed herein). The machine-readable medium (e.g., memory 1660) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

In some embodiments, computing device 1600 comprises connectivity 1670. Connectivity 1670 includes hardware devices (e.g., wireless and/or wired connectors and communication hardware) and software components (e.g., drivers, protocol stacks) to enable the computing device 1600 to communicate with external devices. The computing device 1600 could be separate devices, such as other computing devices, wireless access points or base stations, as well as peripherals such as headsets, printers, or other devices.

Connectivity 1670 can include multiple different types of connectivity. To generalize, the computing device 1600 is illustrated with cellular connectivity 1672 and wireless connectivity 1674. Cellular connectivity 1672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 1674 refers to wireless connectivity that is not cellular, and can include personal area networks (such as Bluetooth, Near Field, etc.), local area networks (such as Wi-Fi), and/or wide area networks (such as WiMax), or other wireless communication.

In some embodiments, computing device 1600 comprises peripheral connections 1680. Peripheral connections 1680 include hardware interfaces and connectors, as well as software components (e.g., drivers, protocol stacks) to make peripheral connections. It will be understood that the computing device 1600 could both be a peripheral device ("to" 1682) to other computing devices, as well as have peripheral devices ("from" 1684) connected to it. The computing device 1600 commonly has a "docking" connector to connect to other computing devices for purposes such as managing (e.g., downloading and/or uploading, changing, synchronizing) content on computing device 1600. Additionally, a docking connector can allow computing device 1600 to connect to certain peripherals that allow the computing device 1600 to control content output, for example, to audiovisual or other systems.

In addition to a proprietary docking connector or other proprietary connection hardware, the computing device 1600 can make peripheral connections 1680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

For example, an apparatus is provided which comprises: an input magnet formed of one or more materials with a sufficiently high anisotropy and sufficiently low magnetic saturation to increase injection of spin currents; and a first interface layer coupled to the input magnet, wherein the first interface layer is formed of a non-magnetic material such that the first interface layer and the input magnet together have sufficiently matched atomistic crystalline layers.

In some embodiments, the apparatus a first spin channel coupled to the first interface layer. In some embodiments, the apparatus comprises an interconnect layer for providing power supply, the interconnect layer coupled to the first spin channel through a via. In some embodiments, the first spin channel partially couples the first interface. In some embodiments, the apparatus comprises a second spin channel coupled partially to the first interface. In some embodiments, the first and second spin channels are separated by an insulator.

In some embodiments, the apparatus comprises a third spin channel coupled to the first and second spin channels and the first interface. In some embodiments, the apparatus comprises a second interface layer coupled to the input magnet, wherein the second interface layer is formed of a non-magnetic material, and wherein the input magnet is sandwiched between the first and second interface layers. In some embodiments, the sufficiently matched atomistic crystalline layers are matched within a threshold percentage which is low enough to not cause lattice mismatch. In some embodiments, the threshold percentage is 4%. In some embodiments, the one or more materials of the input magnet are Heusler alloys. In some embodiments, the non-magnetic material is Ag or Ag-like material. In some embodiments, the sufficiently high anisotropy is greater than 2000 Oe, and wherein the sufficiently low magnetic saturation is less than 200 kA/m.

In another example, a system is provided which comprises: a memory; a processor coupled to the memory, the processor including an apparatus according to the apparatus described above; and a wireless interface for allowing the processor to communicate with another device.

In another example, a method is provided which comprises: depositing a first metal layer; depositing a first interface layer on the first metal layer, the first interface layer formed of a non-magnetic material; depositing a magnet layer over the first interface layer, wherein the magnet layer is formed of a magnetic material with a sufficiently high anisotropy and sufficiently low magnetic saturation to increase injection of spin currents; and depositing a second interface layer over the magnet layer, wherein depositing of the first metal layer, first interface layer, magnet layer, and second interface layer is performed in situ.

In some embodiments, the method comprises: depositing a photo-resist material over the second interface layer to pattern first and second magnets; and etching, after depositing the photo-resist, the second interface layer and the magnet layer to form first and second portions of the second interface layer over the first and second magnets respectively. In some embodiments, the method comprises depositing a spin channel over the first and second portions of second interface layer. In some embodiments, the method comprises etching portions of the spin channel above the first and second input magnets. In some embodiments, the method comprises filing the etched portions with an insulator to provide barriers between portions of the spin channel. In some embodiments, the method comprises: forming a via such that it couples the spin channel at one end of the via; and depositing a second metal layer over the via at the other end of the via. In some embodiments, the magnetic material of the magnet layer is a Heusler alloy.

In another example, an apparatus is provided which comprises: an input magnet formed of a Heusler alloy; and a first interface layer coupled to the input magnet, wherein the first interface layer is formed of a non-magnetic material such that the first interface layer and the input magnet together have sufficiently matched atomistic crystalline layers. In some embodiments, the Heusler alloy is combination of one or more of elements including: Co, Fe, Al, Ge, Ga, Mn, Al, Sn, Ni, Sn, Sb, Si, Pd, and V.

In some embodiments, the Heusler alloy is at least one of: $Co_2FeAl$, $Co_2FeGeGa$, $Cu_2MnAl$, $Cu_2MnIn$, $Cu_2MnSn$, $Ni_2MnAl$, $Ni_2MnIn$, $Ni_2MnSn$, $Ni_2MnSb$, $Ni_2MnGa$, $Co_2MnAl$, $Co_2MnSi$, $Co_2MnGa$, $Co_2MnGe$, $Pd_2MnAl$, $Pd_2MnIn$, $Pd_2MnSn$, $Pd_2MnSb$, $Co_2FeSi$, $Fe_2VAl$, $Mn_2VGa$, or $Co_2FeGe$. In some embodiments, the non-magnetic material is Ag or Ag-like material. In some embodiments, the sufficiently matched atomistic crystalline layers are matched within 4% which is low enough to not cause lattice mismatch. In some embodiments, the apparatus comprises: a first spin channel coupled to the first interface layer; and an interconnect layer for providing power supply, the interconnect layer coupled to the first spin channel through a via. In some embodiments, the first spin channel partially couples the first interface. In some embodiments, the apparatus comprises a second spin channel coupled partially to the first interface, and wherein the first and second spin channels are separated by an insulator. In some embodiments, the apparatus comprises a third spin channel coupled to the first and second spin channels and the first interface.

In another example, a system is provided which comprises: a memory; a processor coupled to the memory, the processor including an apparatus according to the apparatus described above; and a wireless interface for allowing the processor to communicate with another device.

In another example, the apparatus is provided which comprises: an input magnet formed of a combination of Co, Fe, and Al; and a first interface layer coupled to the input magnet, wherein the first interface layer is formed of a non-magnetic material such that the first interface layer and the input magnet together have sufficiently matched atomistic crystalline layers. In some embodiments, the non-magnetic material is Ag or Ag-like material. In some embodiments, the sufficiently matched atomistic crystalline layers are matched within 4% which is low enough to not cause lattice mismatch. In some embodiments, the apparatus comprises: a first spin channel coupled to the first interface layer; and an interconnect layer for providing power supply, the interconnect layer coupled to the first spin channel through a via. In some embodiments, the first spin channel partially couples the first interface. In some embodiments, the apparatus comprises a second spin channel coupled partially to the first interface, and wherein the first and second spin channels are separated by an insulator.

In another example, a system is provided which comprises: a memory; a processor coupled to the memory, the processor including an apparatus according to the apparatus described above; and a wireless interface for allowing the processor to communicate with another device.

In another example, a method is provided which comprises: depositing a first metal layer; depositing a first interface layer on the first metal layer, the first interface layer formed of a non-magnetic material; depositing a magnet layer over the first interface layer, wherein the magnet layer is formed of a Heusler alloy; and depositing a second interface layer over the magnet layer, wherein depositing of the first metal layer, first interface layer, magnet layer, and second interface layer is performed in situ.

In some embodiments, the method comprises: depositing a photo-resist material over the second interface layer to pattern first and second magnets; and etching, after depositing the photo-resist, the second interface layer and the magnet layer to form first and second portions of the second interface layer over the first and second magnets respectively. In some embodiments, the method comprises: depositing a spin channel over the first and second portions of second interface layer; etching portions of the spin channel above the first and second input magnets; and filing the etched portions with an insulator to provide barriers between portions of the spin channel. In some embodiments, the method comprises: forming a via such that it couples the spin channel at one end of the via; and depositing a second metal layer over the via at the other end of the via. In some embodiments, the non-magnetic material is Ag or Ag-like material.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus comprising:
   an input magnet comprising a Heusler alloy; and
   a structure coupled to the input magnet, wherein the structure comprises a non-magnetic material such that the structure and the input magnet together have a sufficiently matched atomistic crystallinity.

2. The apparatus of claim 1, wherein the Heusler alloy is a combination of one or more of the elements selected from the group consisting of: Co, Fe, Al, Ge, Ga, Mn, Al, Sn, Ni, Sn, Sb, Si, Pd, or V.

3. The apparatus of claim 1, wherein the Heusler alloy includes one of: $Co_2FeAl$, $Co_2FeGeGa$, $Cu_2MnAl$, $Cu_2MnIn$, $Cu_2MnSn$, $Ni_2MnAl$, $Ni_2MnIn$, $Ni_2MnSn$, $Ni_2MnSb$, $Ni_2MnGa$, $Co_2MnAl$, $Co_2MnSi$, $Co_2MnGa$, $Co_2MnGe$, $Pd_2MnAl$, $Pd_2MnIn$, $Pd_2MnSn$, $Pd_2MnSb$, $Co_2FeSi$, $Fe_2VAl$, $Mn_2VGa$, or $Co_2FeGe$.

4. The apparatus of claim 1, wherein the non-magnetic material includes one of: Ag or Ag-like material.

5. The apparatus of claim 1, wherein the sufficiently matched atomistic crystallinity is within 4% which is low enough to not cause lattice mismatch.

6. The apparatus of claim 1, wherein the structure is a first structure, wherein the apparatus comprises:
a first channel for carrying spins, the first channel coupled to the first structure; and
a second structure to provide power supply, wherein the second structure is coupled to the first spin channel through a via.

7. The apparatus of claim 6, wherein the first spin channel partially couples the first structure.

8. The apparatus of claim 6 comprises a second channel for carrying spins, the second channel coupled partially to the first structure, and wherein the first and second channels are separated by a material which comprises an insulator.

9. The apparatus of claim 8 comprises a third channel coupled to the first and second channels and the first structure, wherein the third channel is to carry spins.

10. An apparatus comprising:
an input magnet of one or more materials with a sufficiently high anisotropy and sufficiently low magnetic saturation to increase injection of spin currents; and
an interface layer coupled to the input magnet, wherein the interface layer comprises a non-magnetic material such that the interface layer and the input magnet together have sufficiently matched atomistic crystalline layers.

11. The apparatus of claim 10 comprises:
a first spin channel coupled to the interface layer; and
an interconnect layer for providing power supply, the interconnect layer coupled to the first spin channel through a via.

12. The apparatus of claim 11, wherein the first spin channel partially couples the interface.

13. The apparatus of claim 12 comprises a second spin channel coupled partially to the interface, wherein the first and second spin channels are separated by an insulator.

14. The apparatus of claim 13, wherein the interface is a first interface, wherein the apparatus comprises:
a third spin channel coupled to the first and second spin channels and the first interface; and
a second interface layer coupled to the input magnet, wherein the second interface layer is formed of a non-magnetic material, and wherein the input magnet is sandwiched between the first and second interface layers.

15. The apparatus of claim 10, wherein the sufficiently matched atomistic crystalline layers are matched within a threshold percentage which is low enough to not cause lattice mismatch.

16. The apparatus of claim 15, wherein the threshold percentage is 4%.

17. The apparatus of claim 10, wherein the one or more materials of the input magnet comprise Heusler alloys.

18. The apparatus of claim 10, wherein the non-magnetic material comprises one or more of: Ag or Ag-like material.

19. The apparatus of claim 10, wherein the sufficiently high anisotropy is greater than 2000 Oe, and wherein the sufficiently low magnetic saturation is less than 200 kA/m.

20. A method comprising: depositing a first metal layer; depositing a first interface layer on the first metal layer, the first interface layer formed of a non-magnetic material; depositing a magnet layer over the first interface layer, wherein the magnet layer comprises a magnetic material with a sufficiently high anisotropy and sufficiently low magnetic saturation to increase injection of spin currents; and depositing a second interface layer over the magnet layer, wherein depositing of the first metal layer, first interface layer, magnet layer, and second interface layer is performed in situ.

21. The method of claim 20 comprises:
depositing a photo-resist material over the second interface layer to pattern first and second magnets; and
etching, after depositing the photo-resist, the second interface layer and the magnet layer to form first and second portions of the second interface layer over the first and second magnets respectively.

22. The method of claim 21 comprises:
depositing a spin channel over the first and second portions of second interface layer; and
etching portions of the spin channel above the first and second input magnets.

23. The method of claim 22 comprises:
filing the etched portions with an insulator to provide barriers between portions of the spin channel;
forming a via such that it couples the spin channel at one end of the via; and
depositing a second metal layer over the via at the other end of the via.

24. The method of claim 23, wherein the magnetic material of the magnet layer is a Heusler alloy.

25. The method of claim 24, wherein the non-magnetic material is Ag or Ag-like material.

* * * * *